(12) United States Patent
Arkin

(10) Patent No.: US 7,243,278 B2
(45) Date of Patent: Jul. 10, 2007

(54) INTEGRATED CIRCUIT TESTER WITH SOFTWARE-SCALEABLE CHANNELS

(75) Inventor: Brian J. Arkin, Pleasanton, CA (US)

(73) Assignee: Credence Systems Corporation, Milpitas, CA (US)

(*) Notice: Subject to any disclaimer, the term of this patent is extended or adjusted under 35 U.S.C. 154(b) by 71 days.

(21) Appl. No.: 11/227,637

(22) Filed: Sep. 14, 2005

(65) Prior Publication Data
US 2007/0061640 A1 Mar. 15, 2007

(51) Int. Cl.
*G01R 31/28* (2006.01)
(52) U.S. Cl. .................................. 714/724; 714/738
(58) Field of Classification Search ............... 714/724, 714/738
See application file for complete search history.

(56) References Cited
U.S. PATENT DOCUMENTS
5,854,797 A * 12/1998 Schwartz et al. ........... 714/724
5,970,073 A * 10/1999 Masuda et al. ............. 714/738
6,536,006 B1 * 3/2003 Sugamori .................... 714/724
6,678,852 B2 * 1/2004 Tsuto ......................... 714/738
6,856,158 B2 * 2/2005 Frame et al. ................ 324/765

* cited by examiner

Primary Examiner—James C Kerveros
(74) Attorney, Agent, or Firm—Daniel J. Bedell; Smith-Hill and Bedell

(57) ABSTRACT

An integrated circuit tester for testing an IC device under test (DUT) during a succession of test cycles includes a pattern generator programmed to generate data before each test cycle encoded to specify all test activities to be carried out during the test cycle and to specify for each test activity a time during the test cycle at which the test activity is to be carried out and a DUT IO pin at which the test activity is to be carried out. Multiple programmable tester channels each comprise multiple DUT interface circuits, each of which can be connected to a separate DUT IO pin for carrying out test activities at that DUT IO pin when signaled to do so, and hardware resources programmed by decoding instructions to decode the data from the pattern generator for each test cycle and initiate each specified test activity by signaling the DUT interface circuit that is specified for the test activity at the time specified for the test activity.

15 Claims, 8 Drawing Sheets

INTEGRATED CIRCUIT TESTER WITH SOFTWARE-SCALEABLE CHANNELS

BACKGROUND OF THE INVENTION

1. Field of the Invention

The invention relates in general to integrated circuit (IC) testers and in particular to an IC tester having multiple pin channels.

2. Description of Related Art

A typical integrated circuit (IC) tester includes a set of channels, each connected to a separate pin of an IC device under test (DUT). The tester organizes a test into a succession of test cycles, and during any test cycle any channel may transmit a test signal to its corresponding DUT IO pin or may sample a DUT output signal to determine its state. When an IO pin is bi-directional, a channel may alternatively transmit a test signal to the DUT IO pin and sample a DUT output signal at that IO pin during another part of the test cycle. Some IC testers employ a centralized pattern generator that sends control data to each channel before the start of each test cycle for telling the channel what to do during the test cycle. For example, FIG. 1 depicts a prior art integrated circuit tester 10 for testing an IC DUT 12. Tester 10, suitably implemented on a single IC chip, includes a set of N channels {CH1, CH2 . . . CHN}, each for communicating with a separate IO pin (or terminal) of DUT 12. A clock signal generator 14 generates a master clock signal MCLK that signals the start of each test cycle. On each clock signal edge, a programmable pattern generator 16 supplies control data (FSET, TSET, and D1-DN) to channels CH1-CHN to tell them what to do during the next test cycle. All channels CH1-CHN receive the same FSET and TSET data values, but each channel CH1-CHN receives a separate corresponding one of data values D1-DN.

FSET Data

The FSET data supplied to each channel before the start of each test cycle references a pattern of test activities, if any, that the channel is to carry out during the test cycle. Each channel CH1-CHN can carry one or more of several kinds of test activities during a test cycle including turning on a test signal input to the DUT IO pin, driving the test signal to a high or low logic level, turning off ("tristating") the test signal, or sampling a DUT output signal appearing at the DUT IO pin to determine whether it is of an expected state. Each channel CH1-CHN decodes the FSET data to learn the pattern of actions it is to carry out during the test cycle. Although all channels receive the same FSET data at the start of each test cycle, they do not necessarily decode the FSET data in the same way, and therefore they all do not necessarily perform the same pattern of test activities during the test cycle.

TSET Data

Each channel CH1-CHN generates a set of internal timing signals and uses edges of those timing signals to initiate the actions it carries out during a test cycle. Each channel decodes the TSET data supplied to the channel at the start of each test cycle to determine a time during the test cycle each timing signal edge is to occur. When the FSET data indicates that the channel is to carry out one or more test activities during a test cycle, it indicates a time during the test cycle at which each test activity is to occur by selecting a particular timing signal that is to initiate the test activity. Although all channels receive the same TSET data at the start of each test cycle, the manner in which each channel decodes the TSET data is also separately programmable for each channel, so that their timing signals need not necessarily have the same edge timing during any given test cycle.

D1-DN Data

Each channel CH1-CHN receives a corresponding one of input data values D1-DN from the pattern generator at the start of each test cycle, and each channel may use that data when carrying out the test activities specified by the FSET data. For example, the FSET data input to channel CH1 may tell the channel to drive a test signal input to a DUT IO pin to a state or sequence of states specified by the channel's D1 data input. The FSET data may tell channel CH1 to sample a DUT output signal appearing at the pin one or more times during a test cycle to determine whether it is of an expected state, the D1 data input to channel CH1 indicates the expected state of each DUT output signal sample.

Tester Programming

Before the start of a test, an external host computer 18, communicating with tester 10 via a computer bus (CBUS), programs pattern generator 16 to produce appropriate sequences of FSET, TSET and D1-DN data during the test and programs each channel CH1-CHN to appropriately decode its incoming FSET and TSET data. A random access memory (RAM) 20 supplies a separate one of a set of enable signals {E1, E2 . . . EN} to each channel CH1-CHN to tell the channel when it is to communicate with computer 18 via the CBUS. When computer 18 wants to write programming data only to a kth one (CHk) of channels CH1-CHN, it writes an address into register 22 causing enable RAM 20 to drive only the kth enable signal ENk true When computer 18 thereafter sends the programming data out via the CBUS, only the enabled channel CHk receives the programming data. When two or more of channels CH1-CHN are to decode the FSET and TSET data in the same way during a test, computer 18 can write an address into register 22 causing enable RAM 20 to concurrently enable all channels that are to receive the same programming data. Thereafter computer 18 can concurrently send the same programming data to all enabled channels.

Channel Architecture

FIG. 2 illustrates the internal architecture of channel CH1. Channels CH2-CHN are internally similar. A programmable decoder 24 decodes the TSET and FSET data arriving at the start of each test cycle to provide format control data FC to a DUT interface circuit 26 and timing control data TC to a timing signal generator 28 during the test cycle. Decoder 24 supplies the format control data FC to DUT interface circuit 26 to indicate a pattern of test activities the interface circuit is to carry out during the test cycle. Format control data FC may tell DUT interface circuit 26 to sample a DUT output signal appearing at the DUT IO pin to determine whether it is of an expected state as indicated by data D1 and/or to set a tristate test signal input to a single DUT IO pin to a particular state or to a state or succession of states indicated by data D1.

Timing signal generator 28 processes the MCLK signal to supply a set of timing reference signals TS1-TS4 to DUT interface circuit 26. The timing control data TC decoder 24 supplies to timing signal generator 28 at the start of each test cycle indicates a separate time during the test cycle at which an edge is to occur in each timing signal TS1-TS4. When the format control data FC tells DUT interface circuit 26 to carry out a test activity, it selects one of timing signals TS1-TS4 to initiate that test activity. DUT interface circuit 26 then initiates the test activity on the next occurrence of an edge of the selected timing signal. Since four separate timing signals TS1-TS4 are available to tell DUT interface circuit 26 when to carry out a test activity, DUT interface circuit 26 can carry out test activities at up to four different times during any test cycle.

When enabled by the EN1 signal, a bus interface circuit 29 permits computer 18 of FIG. 1 to program decoder 24 and DUT interface circuit via programming data sent via computer bus CBUS before the start of a test. At the end of a test, bus interface circuit 29 permits computer 18 to acquire test result data from DUT interface circuit 26 indicating whether any DUT output signal sample was of an unexpected state during any test cycle. Computer 18 also programs bus interface circuit 29 to provide control data to DUT interface circuit 26 for setting the high and low logic levels of the test signal and for setting the reference voltage levels DUT interface circuit 26 uses to determine whether the DUT output signal samples are of high or low logic levels.

FIG. 3 illustrates channel CH1 of FIG. 2 in more detail. A pair of RAMs 40 and 42 implement programmable decoder 24 of FIG. 2. DUT interface circuit 26 of FIG. 2 includes a tristate driver 30, a formatter circuit 32, a receiver 34 and a fail logic circuit 36. Timing signal generator 28 of FIG. 2 includes a master timing signal generator 46 and a set of timing verniers 38A-38D.

RAM 40 decodes the incoming FSET data to provide format control data FC to formatter 32 and fail logic circuit 36 at the start of each test cycle. The FC data tells formatter circuit 32 how to control the states of a set of control signals DH, DL and Z that tell driver 30 when to drive the test signal to a high or low logic level and when to tristate it. Receiver 34 monitors the DUT output signal and supplies a signal COMP to fail logic circuit 36 indicating whether it is of a high or low logic state. The format control data FC tells fail logic circuit 36 when, during any given test cycle, to sample the COMP signal input from receiver 34 and compare its state to its expected value as indicated by the D1 data input from pattern generator 16 of FIG. 1. Since fail logic circuit 36 can sample the COMP signal up to four times during any test cycle, the D1 data is suitably four bits wide to provide a separate bit for indicating the expected state of each of four COMP signal samples.

A master timing circuit 46 processes the MCLK signal to produce several timing reference signals TREF, each having the same frequency as the MCLK signal but being of a different phase, such that edges of the TREF signals are evenly distributed in time during each test cycle. RAM 42 decodes the TSET data to provide timing control data to a set of timing verniers 38A-38D that produce timing signals TS1-TS4 to tell each timing vernier 38A-38D when to produce an edge in its corresponding one of timing signals TS1-TS4 during the test cycle by interpolating between edges of selected TREF signals. The FC data input to formatter 32 tells the formatter when to change a state of the test signal input to the DUT by referencing one of timing signals TS1-TS4 that is to initiate the test signal state change action. The FC data input to fail logic circuit 36 tells the fail logic circuit when to sample the COMP signal by referencing one of timing signals TS1-TS4 that is to initiate the sampling operation.

Bus interface circuit 29 permits computer 18 of FIG. 1 to write or read access the various components of channel CH1 before or after the test when enable line EN1 is true. Computer 18 can write FSET decoding data into RAM 40 and TSET decoding data into RAMs 42A-42D to control the manner in which the channel decodes the FSET and TSET data. Computer 18 can write to registers in bus interface circuit 50 that supply control data to driver 30 and receiver 34 for controlling the logic levels of the test signal and the high and low logic detection levels of receiver 34. Computer 18 can also read access a memory within fail logic circuit 36 that the fail logic circuit uses to store data indicating each test cycle, if any, in which the sampled COMP signal state failed to match its expected state.

Thus each channel CH1-CHN of tester 10 of FIG. 1 can carry out up to four test activities per test cycle because each tester channel generate four timing signals TS1-TS4 that it can use to initiate each of up to four test activities. Tester 10 requires one channel CH1-CHN for each DUT IO pin, and can test any DUT having up to N pins It can also test more than one DUT concurrently if the total number of DUT IO pins is no larger than N. When tester 10 is implemented on a single IC chip, the number N of channels is limited by the size of the IC chip and the number of transistors and other components that can be formed on the IC. Therefore the number of DUT IO pins tester 10 can access is limited by the number N of channels that can be implemented on the IC chip.

Referring to FIG. 3, a substantial portion of the resources of each tester channel is devoted to decoding the FSET and TSET data to produce the format control data FC and timing signals TS1-TS4 needed to control test activities. Although, a channel needs four timing signals TS1-TS4 only when it must carry out four test activities during a single test cycle, in most IC tests, most tester channels need carry out no more than one or two test activities per test cycle. For example in many IC tests, a tester may change the state of a clock signal input to a DUT four times per test cycle but will change the states of all data signal inputs to the DUT no more than once or twice during any test cycle, and will sample each DUT output signal only once per test cycle. Thus a tester will not make full use of much of the decoding and timing signal generation resources of most of its tester channels during the test.

One approach to increasing the number of channels that can be implemented on an IC is reduce the size of each channel by providing channels that can carry out only one activity per test cycle. This reduces the size of the channels because it eliminates almost three quarters of the circuitry needed to decode the TSET data and produce timing signals, but in order to provide test signals with sufficient frequency, it is also necessary to reduce the test cycle period by a factor of four. This means that the speed of pattern generator 16 of FIG. 1 must be increased by a factor of four so that it can supply data at a four time higher rate than otherwise required when a channel can carry out four test activities per test cycle. Unfortunately, the necessary increase in speed of pattern generator 16 may not be attainable or may be attainable only at substantially increased cost.

What is needed is way to increase the total number DUT IO pins tester 10 can accommodate without substantially increasing the size of the IC needed to implement tester 10, or the frequency at which its pattern generator must operate.

SUMMARY OF THE INVENTION

An integrated circuit tester in accordance with the invention includes a pattern generator and a set of N "scaleable" channels CH1-CHN, where N is an integer greater than 1. Each scaleable channel may be connected to from one to J device under test (DUT) input/output (IO) pins or terminals, where J is greater than 1. The tester organizes a test into a succession of test cycles, and before each test cycle a central pattern generator supplies the control data to all channels CH1-CHN describing a pattern of test activities each channel is to carry out during that test cycle. The test activities may include changing a state of a test signal the channel sends to a DUT pin or sampling a DUT output signal appearing at a DUT IO pin to determine whether it is of an expected state.

Each channel includes a programmable decoder, a timing signal generator and a DUT interface circuit. The decoder decodes the control data from the pattern generator to produce control signals for controlling the timing signal generator and the DUT interface circuit. The timing signal generator produces M timing signals, where M is at least as large as J, each timing signal having an edge occurring at a time during each test cycle controlled by the control signals from the decoder. The control signals produced by the decoder can tell the DUT interface circuit to carry out a total of up to M test activities at the up J DUT IO pins to which the channel is connected, with each test activity being initiated by a separate one of the timing signals selected by the control signals.

The tester channels are "software-scaleable" because, depending on how its decoder is programmed to process the control data from the pattern generator, each tester channel can act as a single conventional tester channel devoting all of its decoding and timing resources to enabling its DUT interface circuit to carrying out up to M test activities at that single DUT IO pin or can act as a plurality of tester channels sharing the same decoding and timing resources and carrying out a total of M test activities at a plurality of DUT IO pins.

The decoding and timing signal resources of a conventional (non-scaleable) tester channel capable of carrying out test activities at only a single DUT IO pin typically require a substantially larger portion of the tester channel's floor space on an integrated circuit than its DUT interface circuit. A scaleable tester channel in accordance with the invention, capable of carrying out test activities at J>1 DUT IO terminals, can employ the same decoding and timing signal resources as a non-scaleable channel. Although the scaleable channel requires a larger DUT interface circuit than the DUT interface of a non-scaleable channel, the larger DUT interface circuit occupies only a relatively small portion of the tester channel's floor space on an IC. Thus an IC tester employing scaleable channels in accordance with the invention can test a DUT having up to J times as many IO pins as a conventional IC tester having non-scaleable tester channels, without requiring much more IC floor space per channel.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

A conventional (non-scaleable) integrated circuit (IC) tester channel can carry out one or more test activities at a single device under test (DUT) input/output (IO) pin during each of a succession of test cycles. The present invention relates to an IC tester having software-scaleable channels. Depending on how it is programmed, each scaleable channel can carry out a total of M test activities during each test cycle at up to J DUT IO terminals, where J is an integer greater than 1 and M is at least as large as J. The specification describes one example tester in accordance with the invention for which J=2 and M=4 and another example tester for which J=4 and M=4, however those of skill in the art will appreciate that in other embodiments of the invention, J and M may have other values and that testers in accordance with the invention may vary in architecture from the embodiments described below. Thus while this specification describes two exemplary embodiments of the invention considered best modes of practicing the invention, it should be understood that the embodiments described below exemplify, but do not necessarily limit, the invention as recited by the claims appended to this specification.

Two Pin Scaleable Channel Tester

Figure 4:
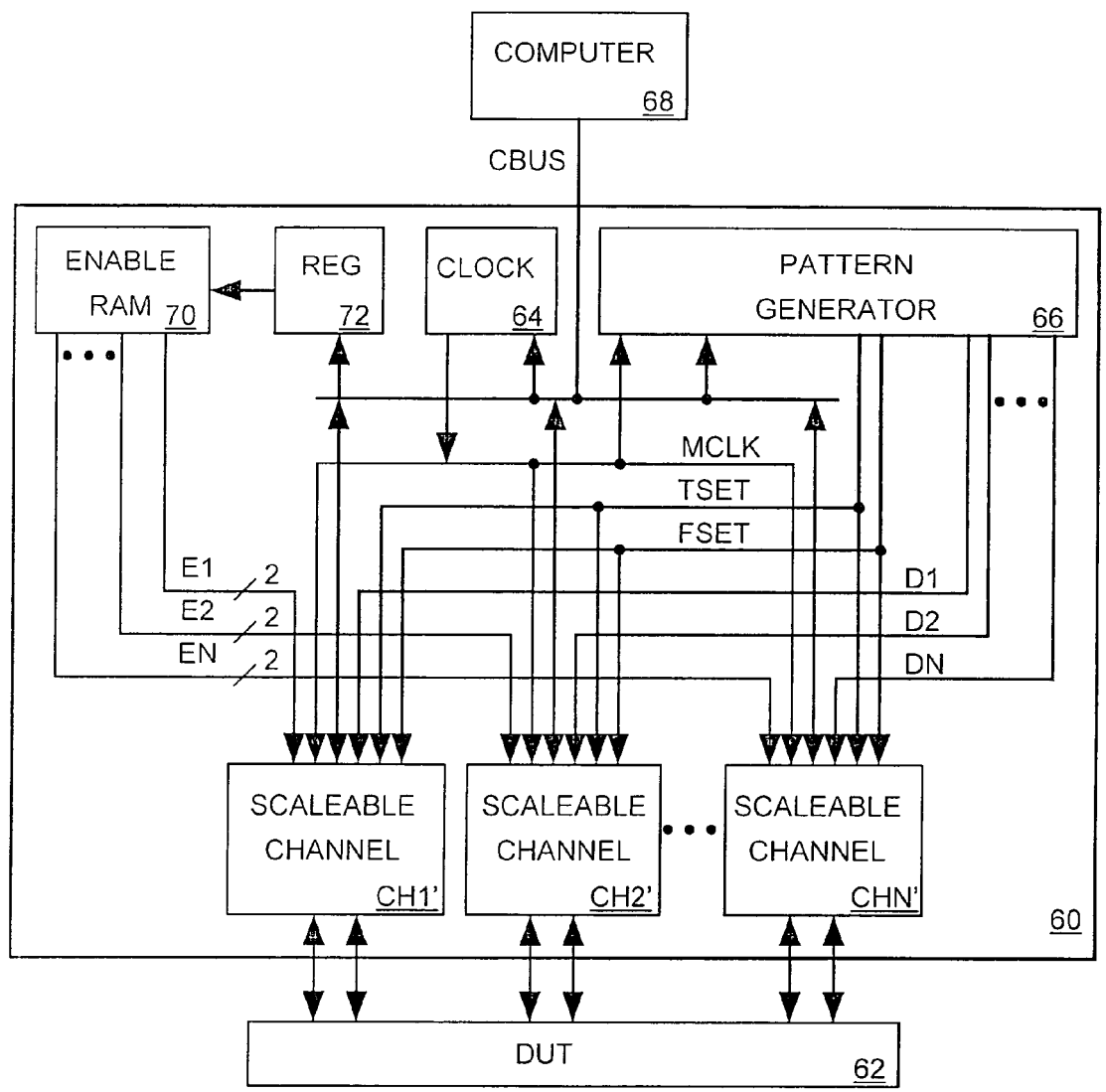
FIG. 4 depicts an IC tester in accordance with the invention in block diagram form.

FIG. 4 depicts an integrated circuit tester 60 in accordance with the invention for testing an IC device under test (DUT) 62. Tester 60, which may be implemented on a single IC, includes a set of N software-scaleable channels {CH1', CH2' . . . CHN'}, each for carrying out test activities at up to J separate input/output (IO) pins of DUT 62, where in this example J=2 and N may be any integer greater than one. Tester 60 organizes a test into a succession of test cycles, and during any test cycle, any scaleable channel CH1'-CHN' may carry out a total of M test activities at up to two DUT IO pins to which it may be connected. In this example M=4. A test activity at a DUT IO pin may either be driving a test signal input to a DUT IO pin to a high logic level or a low logic level, turning a test signal off (i.e., "tristating" it) so that it has no influence on the DUT IO pin, or sampling a DUT output signal appearing at the DUT IO pin to determine whether it is of an expected state. When a DUT IO pin is bi-directional, a scaleable channel CH1'-CHN' may at times change a state of a test signal to that DUT IO pin and at other times sample a DUT output signal appearing at that DUT IO pin.

A clock signal generator 64 generates and supplies to each scaleable channel CH1'-CHN' a master clock signal MCLK having edges signaling the start of each test cycle. A programmable pattern generator 66 responds to each MCLK signal edge by supplying the same global control data (FSET, TSET) to every scaleable channel CH1'-CHN' and by supplying separate channel data (D1-DN) to each scaleable channel CH1'-CHN' for controlling the behavior of each during the next test cycle.

Format Set Data

Each scaleable channel CH1-CHN decodes the FSET (format set) data to learn the pattern of actions, if any, it is to carry out during the test cycle. The manner in which each channel decodes the FSET data is separately programmable for each channel. Thus, although all channels receive the same FSET data at the start of each test cycle, they do not necessarily decode the FSET data in the same way, and therefore they all do not necessarily perform similar test actions during the test cycle.

Time Set Data

Each scaleable channel CH1'-CHN' generates a set of internal timing signals and uses edges of those timing signals to initiate the actions it carries out during a test cycle. Each scaleable channel decodes the TSET (time set) data pattern generator 66 supplies to all channels at the start of each test cycle to determine a time during the test cycle each timing signal edge is to occur. When the FSET data indicates that the channel is to carry out a test activity during a test cycle, it indicates a time during the test cycle at which the test activity is to occur by selecting the particular timing signal that is to initiate that test activity. The manner in which each channel decodes the TSET data is also separately programmable for each channel. Thus, although all channels receive the same TSET data at the start of each test cycle, they do not necessarily decode the TSET data in the same way, and therefore do not necessarily have similar timing signal edge timing during the test cycle.

Channel Data

Each channel CH1'-CHN' receives a corresponding one of input channel data values D1-DN from pattern generator 66 at the start of each test cycle, and may use that data when carrying out the test activities specified by the FSET data. For example, the FSET data input to channel CH1 may tell the channel to drive a test signal input to a DUT IO pin to a state or sequence of states specified by the channel's D1 data input. Alternatively, when the FSET data tells channel CH1 to sample a DUT output signal appearing at a DUT IO pin one or more times during a test cycle to determine whether it is of an expected state, the D1 data input to channel CH1 indicates the expected state of each DUT output signal sample.

An external computer 68, communicating with tester 60 via a computer bus (CBUS), programs pattern generator 66 to produce appropriate sequences of FSET, TSET and D1-DN data during the test and also programs each scaleable channel CH1'-CHN' to appropriately decode its incoming FSET and TSET data. A random access memory (RAM) 70 addressed by data in a register 72, supplies a separate one of a set of 2-bit enable signals {E1, E2 . . . EN} to each scaleable channel CH1'-CHN' to enable the channel to communicate with computer 68 via the CBUS. Each bit of the two-bit kth enable signal Ek input to the kth scaleable channel CHk corresponds to a separate one of the IO pins that scaleable channel can access, and computer 68 tells RAM 70 to set either one of those bits true when the computer wants to send programming data for controlling the behavior of the channel with respect to the corresponding IO pin. When two or more scaleable channels CH1'-CHN' are to receive the same programming data, computer 68 can write an address into register 72 via computer bus CBUS that will cause enable RAM 70 to set more than one enable bit true to concurrently enable all scaleable channels that are to receive the same programming data. Thereafter computer 68 can concurrently send the same programming data to all enabled scaleable channels.

Figure 5:
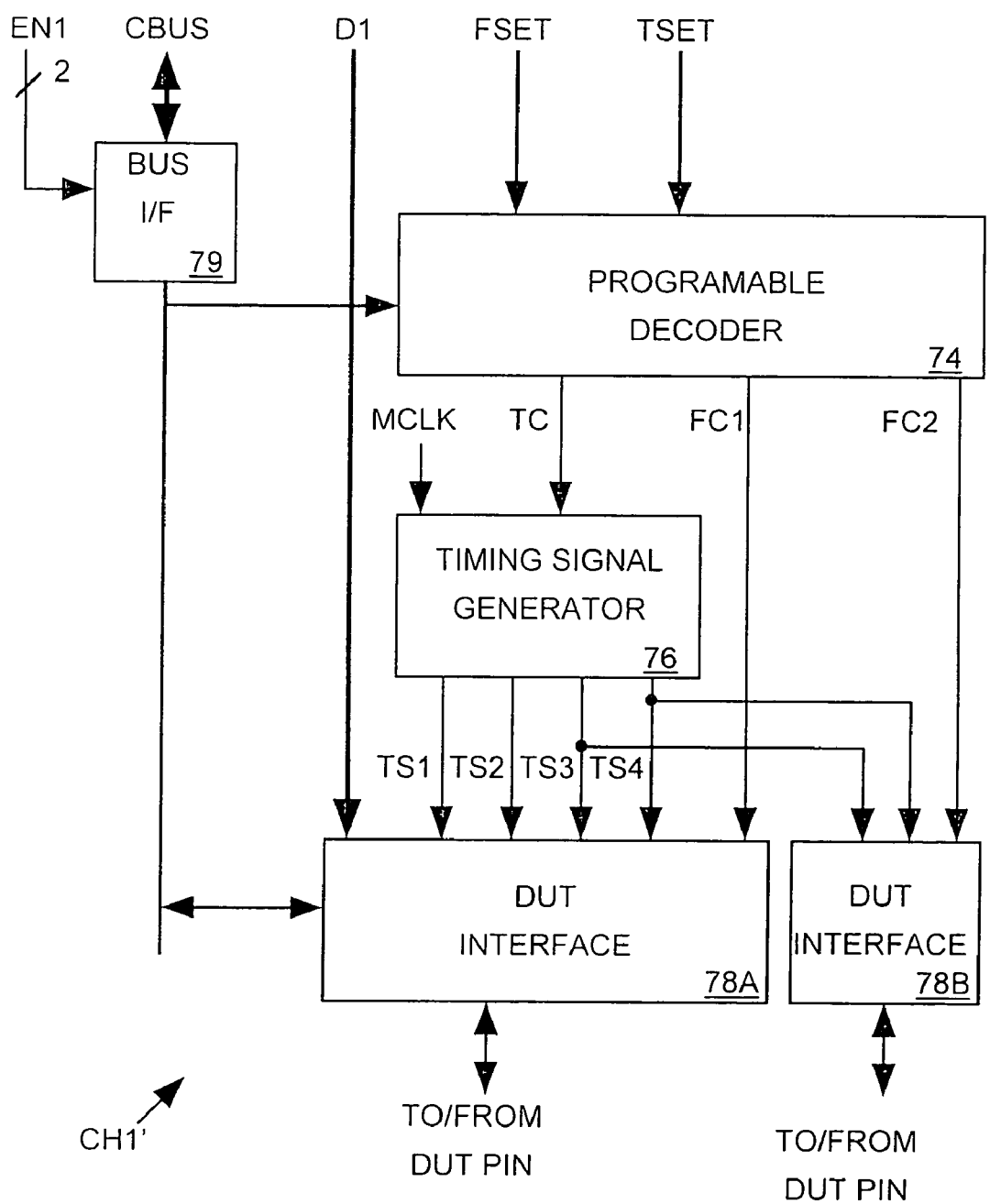
FIG. 5 depicts one of the scaleable channels of the IC tester of FIG. 4 in more detailed block diagram form.

FIG. 5 illustrates the internal architecture of scaleable channel CH1' of FIG. 4 in more detailed block diagram form. Scaleable channels CH2'-CHN' are similar. A programmable decoder 74 decodes the TSET and FSET data for each test cycle to provide format control data FC1, FC2 to DUT interface circuits 78A, 78B and timing control data TC to a timing signal generator 76.

Decoder 74 supplies format control data FC1, FC2 to DUT interface circuits 78A, 78B at the start of each test cycle to indicate a pattern of activities the interface circuit is to carry out during the test cycle. DUT interface circuit 78 can supply a tristate test signal to up to two DUT IO pins, and in such case the format control data FC may either directly indicate a state to which each test signal is to be driven during the test cycle or may indicate that the test signal is to be driven to a state or succession of state indicated by channel data D1. Format control data may also tell DUT interface circuit 78 to sample a DUT output signal appearing at either DUT IO pin to determine whether it is of an expected state. In such case channel data D1 indicates an expected state of each DUT output signal sample.

The timing control data TC that decoder 74 supplies to timing signal generator 76 at the start of each test cycle indicates times during the test cycle at which it is to produce edges in each of a set of four timing signals TS1-TS4. The format control data FC input to DUT interface 78 indicates a time DUT interface 78 is to carry out each activity by referencing one of timing signals TS1-TS4, and DUT interface circuit 78 initiates the test activity in response to an edge of the referenced timing signal.

When enabled by the E1 signal, a bus interface circuit 79 allows computer 68 of FIG. 4 to program decoder 74 and DUT interface circuit 78 before the start of a test using programming data sent via computer bus CBUS. Bus interface circuit also allows computer 68 to acquire test result data from interface circuit 78 indicating whether the DUT output signal was of an unexpected state during any test cycle. Computer 68 also writes control data into interface circuit 78 for controlling the high and low logic levels of the test cycle and the reference voltage levels the interface circuit uses to determine whether the DUT output signal samples are of high or low logic levels.

Since timing signal generator 78 provides four separate timing signals TS1-TS4 to DUT interface circuit 78 for initiating test activities, DUT interface circuit 78 can carry out test activities at up to four times during any one test cycle. Thus when it is connected to only one DUT IO pin, DUT interface circuit 78 can carry out up to four test activities at that Io pin during any one test cycle, and when it is connected to two DUT IO pins, it can carry out up two test activities per pin per test cycle. Channel CH1' is therefore "software-scaleable" in the sense that, depending on how decoder 74 is programmed, it can act as either one conventional tester channel capable of carrying out up to four test activities at a single DUT IO pin during each test cycle, or as two conventional tester channels, each capable of carrying out up to two test activities per test at a single DUT Io pin.

Figure 6:
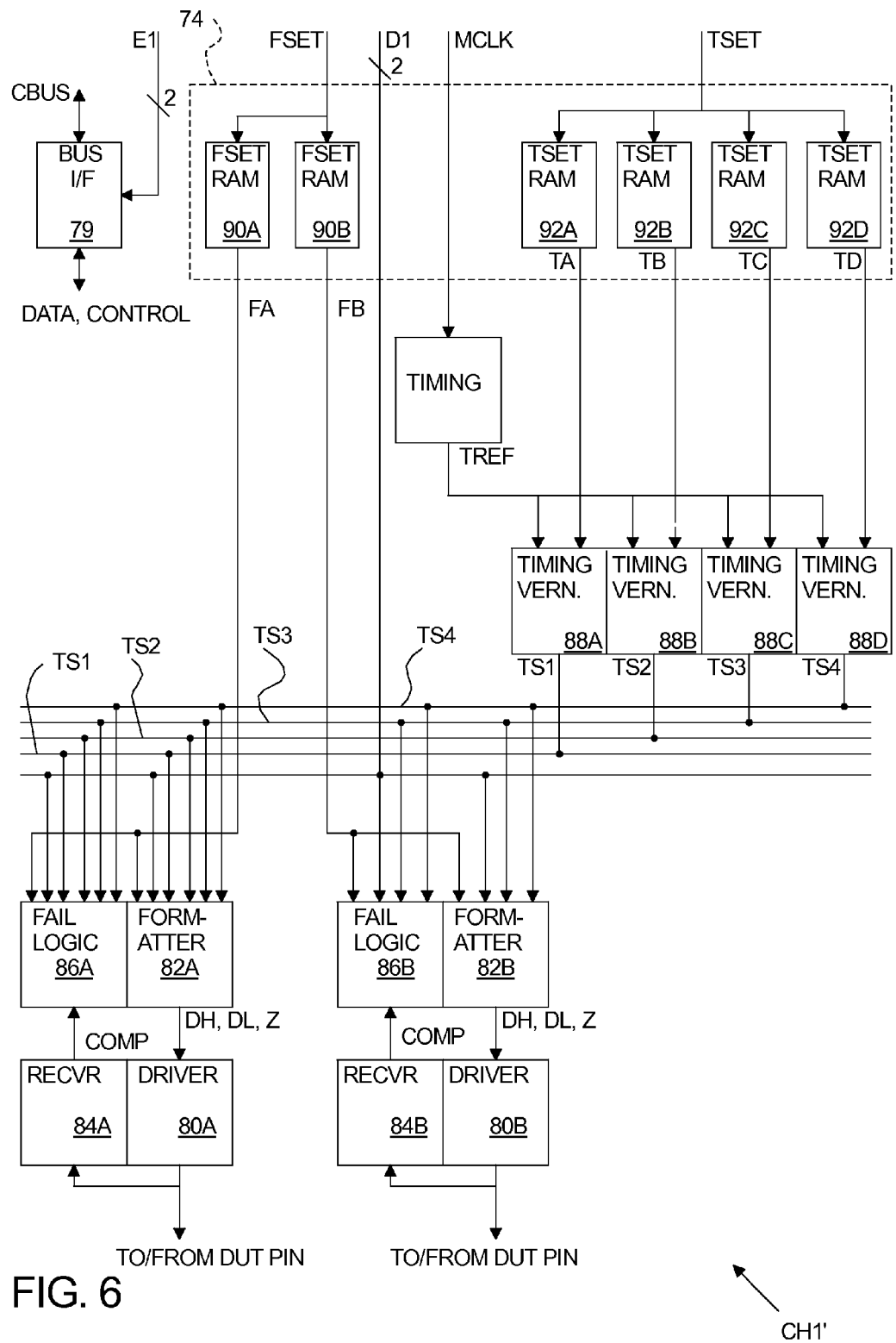
FIG. 6 depicts the scaleable channel of FIG. 5 in still more detailed block diagram form.

FIG. 6 illustrates scaleable channel CH1' of FIG. 5 in more detail. A set of RAMs 90A, 90B, and 92A-92D implement programmable decoder 74 of FIG. 5. DUT interface circuit 78A of FIG. 5 includes a tristate driver 80A, a formatter circuit 82A, a receiver 84A and a fail logic circuit 86A. DUT interface circuit 78B of FIG. 5 includes a tristate driver 80B, a formatter circuit 82B, a receiver 84B and a fail logic circuit 86B. Timing signal generator 76 of FIG. 5 includes master timing signal generator 96 and a set of four timing vernier circuit's 88A-88D.

Tristate drivers 80A and 80B can each generate and supply a test signal to a separate DUT IO pin, and formatter circuits 82A and 82B supply signals DH, DL and Z that tell drivers 84A and 84B when to drive their test signals output to high and low logic levels and when to tristate them. Receivers 84A and 84B can monitor DUT output signals that may appear at separate DUT IO pins, and each receiver supplies a signal COMP to a corresponding fail logic circuit 86A or 86B indicating whether the DUT output signal it monitors is of a high or low logic state. Fail logic circuits 86A and 86B can sample the COMP signal inputs from receivers 84A and 84B at selected times during each test cycle and compare their state to their expected values.

RAMs 90A and 90B separately decode the incoming FSET data to provide format control data FA and FB to formatters 82A and 82B and to fail logic circuits 86A and 86B at the start of each test cycle, the format control data indicating the actions to be carried out during the test cycle and indicating which of the four timing signals TS1-TS4 is to initiate each test action. RAMs 92A-92D separately decode the TSET data to provide separate timing control data TA-TD to timing verniers 88A-88D at the start of each test cycle to tell each timing vernier when it is to assert its corresponding one of timing signals TS1-TS4 during the test cycle.

Timing signal generator 96 processes the MCLK signal to supply a set of timing reference signals TREF to timing verniers 88A-88D for use as timing references for producing edges in the timing signals TS1-TS4 that the timing verniers send to formatter circuits 82A and 82B and fail logic circuit 86A and 86B. Each of timing signals TREF has the same frequency as the MCLK signal but all of the TREF signals are of differing phase. The timing control output of RAM 92 tells each timing vernier 88A-88D when to produce an edge in its output timing signal TS1-TS4 during each test cycle. Each of the four timing vernier circuits 88A-88D supplies a separate one of the four timing signals TS1-TS4 to formatter circuit 82A for use in initiating state changes in the test signal output of driver 80A and to fail logic circuit 86A for use in initiating sampling events. When scaleable channel CH1' is connected to only a single DUT IO pin, driver 80A supplies a test signal input to that pin and receiver 84A monitors any DUT output signal appearing at that pin. In that case, formatter circuit 82A can tell driver 80A to change the state of the test signal up to four times per test cycle and fail logic circuit 86A can sample the COMP signal output of receiver 84A up to four times per test cycle as long as the total number of test signal state changes and COMP signal sampling events do not exceed four, since only four timing signals TS1-TS4 are available as timing references.

Fail logic circuit 86B and formatter 82B receive only timing signals TS3 and TS4. When scaleable channel CH1' is connected to two DUT IO pins, driver 80A and receiver 84A are connected to one DUT IO pin and driver 80B and receiver 84B are connected to the other DUT IO pin. In that case, formatter 82A can signal driver 80A to change the state of its test signal output up to two times per test cycle using the TS1 and TS2 signals as timing references and formatter 82B can signal driver 80B to change the state of its test signal output up to two times per test cycle using the TS3 and TS4 signals as timing references. Fail logic circuit 86A can sample the COMP signal output of receiver 84A up to two times per test cycle using the TS1 and TS2 signals as timing references and fail logic circuit 86B can sample the COMP signal output of receiver 84B up to two times per test cycle using the TS3 and TS4 signals as timing references. However a total of no more than two test signal state changes or COMP signal sampling events can occur at any one pin during any one test cycle.

Computer 68 can supply decoding data concurrently to the bus interface circuit 79 of every scaleable channel, and that decoding data can include format control data to be written into one or both of RAMs 90A, 90B or timing control data to be written into one or more of RAMs 92A-92D, along with information indicating the RAM address to which the data is to be written. RAMs 90A and 90B occupy a same first address space on the CBUS. RAMs 92A and 92C each occupy a same second address space, and RAMS 92B and 92D each occupy a same third address space. Each of FSET RAMs 90A and 90B and each of TSET RAMs 92A and 92B correspond to one bit of enable signal E1 while each of FSET RAM 90B and TSET RAMs 92C and 92D corresponds to the other bit of enable signal E1. When computer 68 wants to write decoding data to one of RAMs 90A, 90B, or 92A-92D, it asserts the corresponding bit of enable signal E1 when it sends the decoding data to bus interface circuit 79. Bus interface circuit 79 then writes the timing or format control data included in the decoding data into the indicated address of the TSET or FSET RAM. When both bits of the enable signal are asserted, bus interface 79 writes the format control data into corresponding addresses of both RAMs 90A and 90B or writes timing control data into corresponding address of both RAMs 92A and 92B or of both RAMs 92C and 92D.

Computer 68 can also write to registers in bus interface circuit 79 that supply control data to drivers 80A and 80B and receivers 84A and 84B for controlling the logic levels of the test signals and the high and low logic detection levels of receivers 84A and 84B. Each enable signal EN1 also corresponds to a separate one of fail logic circuits 86A and 86B. When the test is complete, computer 68 can assert the enable signal corresponding to either of fail logic circuits 86A and 86B and then, via bus interface circuit 79, read data stored in a memory within that fail logic circuit indicating whether any COMP signal sample failed to match its expected value.

Thus each scaleable channel CH1'-CHN' of tester 60 of FIG. 4 can act either as a single conventional tester channel communicating with a single DUT IO pin or as two conventional tester channels communicating with two DUT IO pins.

The hardware resources (devices 88A-88D, 90A, 90B, 92A-92D) of the channel that generate the timing signals and decode the data from the pattern generator 66 to tell the DUT interface circuits what to do during each test cycle, can initiate up to M=4 test activities per test cycle specified by the data from pattern generator 66. The decoding instructions computer 68 supplies to bus interface circuit 79 conveying format and timing control data to be written into RAMs 90A, 90B and 92A-92D allocate the hardware resources so that they signal only those of the DUT interface circuits that are currently connected to DUT IO pins to carry out test activities cycle specified by the FSET, TSET and D1 data from the pattern generator. When it acts as a single tester channel connected to a single DUT IO pin, a scaleable channel can carry out up to four activities (test signal state changes and or COMP signal sampling events) per test cycle at that DUT IO pin. When it acts as two DUT IO channels connected to two DUT IO pins, any channel CH1'-CHN' can carry out up to two activities per test cycle at each of those two DUT IO pins.

Four Pin Scaleable Channel Tester

Figure 7:
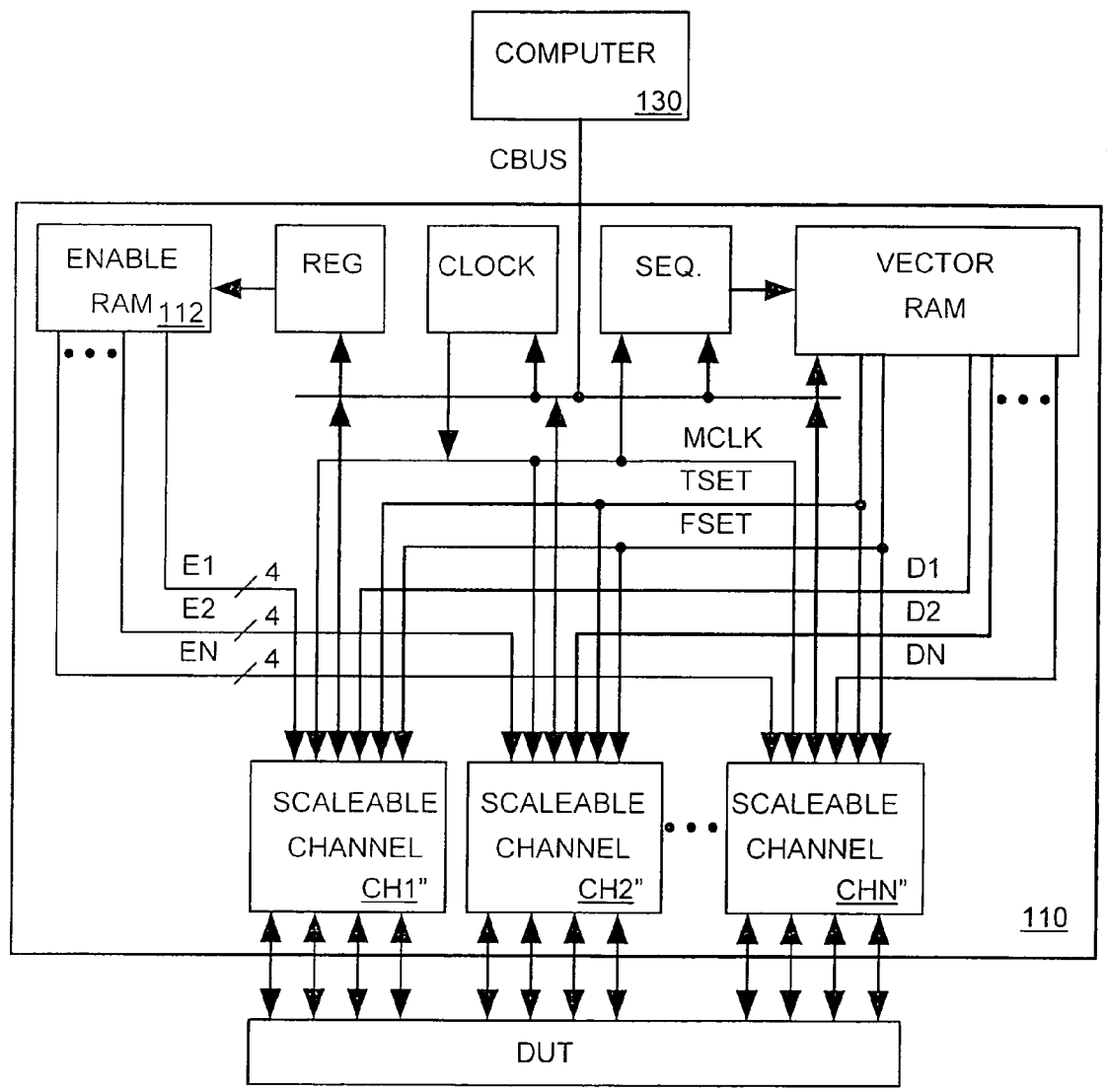
FIG. 7 depicts an alternative embodiment of an IC tester in accordance with the invention in block diagram form.

FIG. 7 illustrates a tester 110 in accordance with an alternative embodiment of the invention that is generally similar to tester 60 of FIG. 4 except that it includes a set of scaleable channels CH1'-CHN', each of which is capable of communicating with up to four DUT IO pins. The enable RAM 112 of tester 110 is also larger than the enable RAM 70 of tester 60 because it must provide four-bit (rather than two-bit) enable signals E1-EN to scaleable channels CH1'-CHN'.

Figure 8:
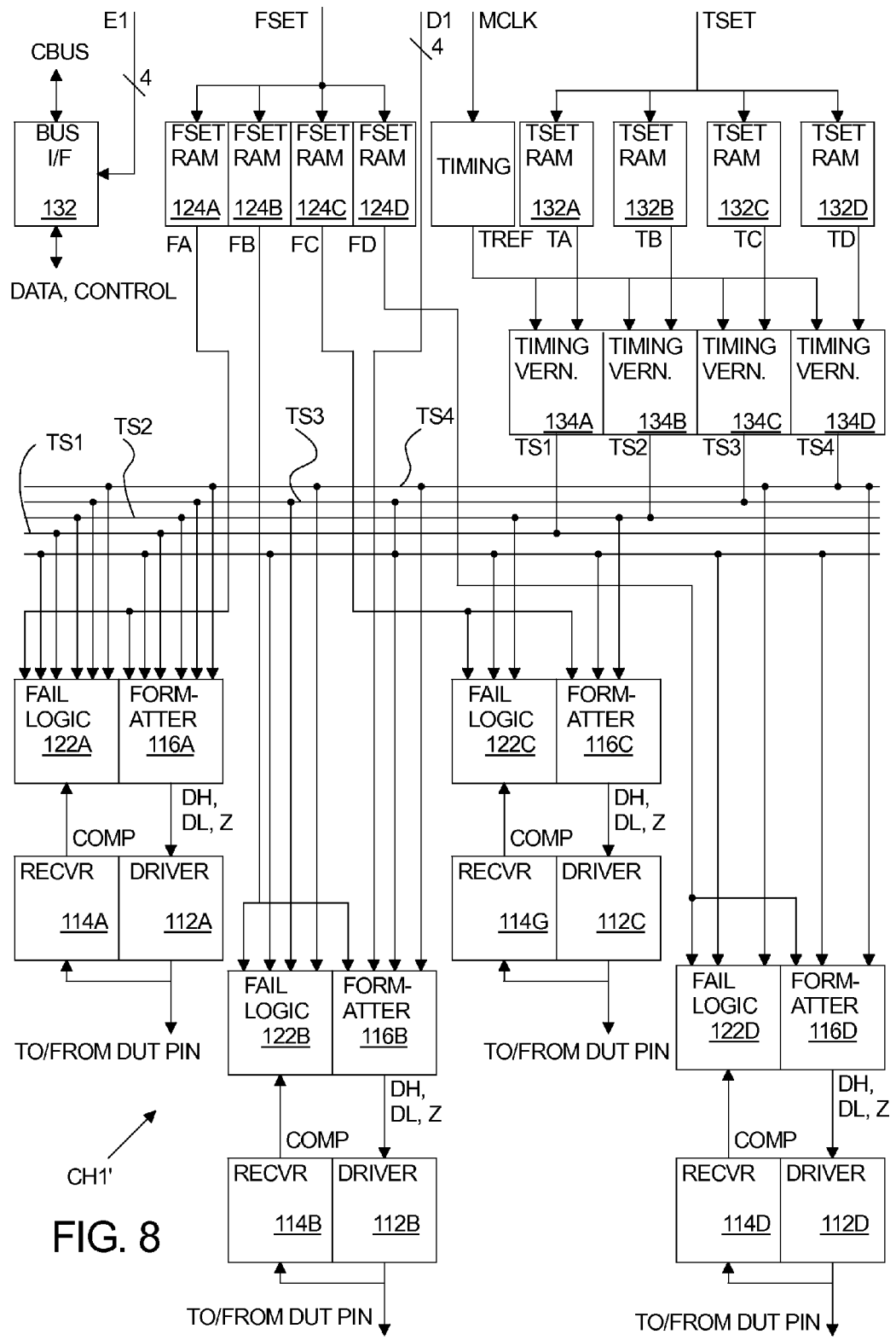
FIG. 8 depicts one of the scaleable channels of the IC tester of FIG. 7 in more detailed block diagram form.

FIG. 8 illustrates scaleable channel CH1' of FIG. 7; scaleable channels CH2'-CHN' are similar. Scaleable channel CH1' of FIG. 8 uses four DUT interface circuits to communicate with up to four DUT IO pins. Each DUT interface includes a corresponding one of drivers 112A-112D, receivers 114A-114D, formatters 116A-116D and fail logic circuits 122A-122D.

Formatter 116A and fail logic circuit 122A receive all four timing signals TS1-TS4 so that when scaleable channel CH1' is connected to only a single DUT IO pin driver 112A can supply a test signal having up to four state changes per test cycle and fail logic circuit can sample the COMP signal output of receiver 114A up to four times per test cycle.

Formatter 116B and fail logic circuit 122B receive timing signals TS3 and TS4. When scaleable channel CH1' is connected to two DUT IO pins, drivers 122A and 122B and receivers 114A and 114B communicate with the two pins. Timing signals TS1 and TS2 can initiate up to two test activities at one of the DUT IO pins and timing signals TS3 and TS4 can initiate up to two test activities at the other of the two pins.

Fail logic circuit 122C and formatter 116C receive only timing signal TS2 while fail logic circuit 122D and formatter 122D receive only timing signal TS4. When channel CH1' is connected to four DUT IO pins, timing signal TS1 can initiate up to one event per test cycle at the DUT IO pin connected to driver 112A and receiver 114A, timing signal TS2 can initiate up to one event per test cycle at the DUT IO pin connected to driver 112C and receiver 114C, timing signal TS3 can initiate up to one event per test cycle at the DUT IO pin connected to driver 112B and receiver 114B, and timing signal TS4 can initiate up to one event per test cycle at the DUT IO pin connected to driver 112D and receiver 114D.

Channel CH1' includes a set of four FSET RAMS 124A-124B for decoding the FSET data to produce separate format control data FA-FD for each of the four DUT interface circuits and a set of four TSET RAMS 132A-132D for decoding the TSET data to provide separate timing control data to timing vernier circuits 134A-134D. Each of FSET RAMs 124A-124D and each of TSET RAMs 132A-132D corresponds to a separate one of the four EN1 signals. Computer 130 of FIG. 7 can supply decoding data concurrently to the bus interface circuit 132 of every scaleable channel CH1'-CHN', and that decoding data can include format control data to be written into one or more of FSET RAMs 124A-124D or timing control data to be written into one or more of TSET RAMS 132A-132D, along with information indicating the RAM address to which the data is to be written. When computer 130 wants to write decoding data to one of RAMs 124A-124D or 132A-132D, it asserts the corresponding EN1 signal when it sends the decoding data to bus interface circuit 132. Bus interface circuit 132 then writes the timing or format control data included in the decoding data into the indicated address of the TSET or FSET RAM. When more than one of enable signal E1 are asserted, bus interface 132 writes the format control data into corresponding addresses of all RAMs corresponding to the asserted enable signals.

Computer 130 can also write to registers in bus interface circuit 132 that supply control data to drivers 112A-112D and receivers 114A-114D and 80B for controlling the logic levels of the test signals and the receiver's high and low logic detection levels. Each bit of enable signal E1 also corresponds to a separate one of fail logic circuits 122A-122D. When the test is complete, computer 130 can assert the enable signal corresponding to any one of fail logic circuits 122A-122D and then, via bus interface circuit 132 read data stored in a memory within that fail logic circuit indicating whether any COMP signal sample failed to match its expected value.

Figure 1:
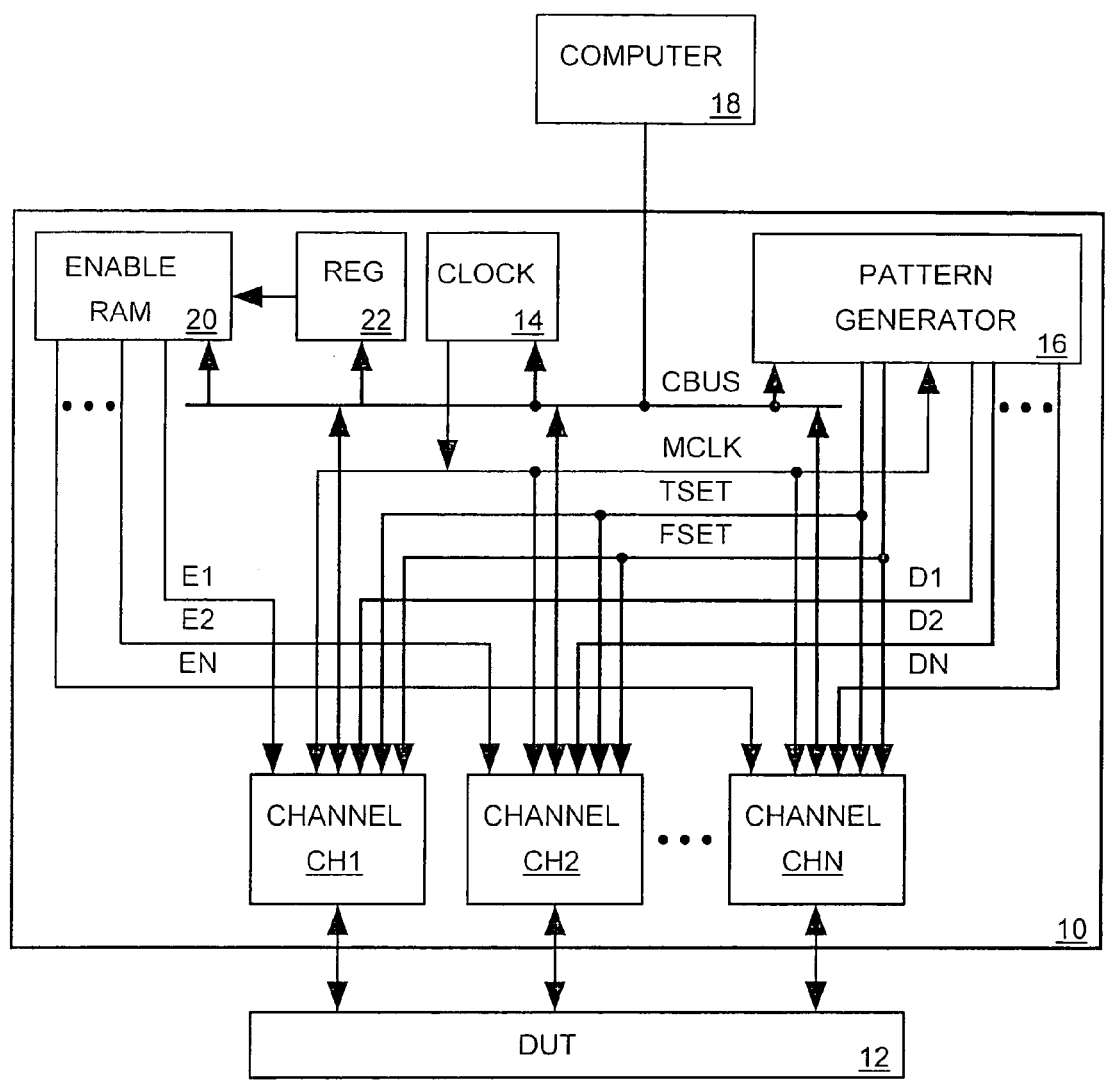
FIG. 1 depicts a prior art integrated circuit (IC) tester in block diagram form.

Testers 60 and 110 of FIGS. 4 and 7 can be viewed as improvements to the prior art tester 10 of FIG. 1. Given the same number N of channels as prior art tester 10, tester 60 can test a DUT having up to twice as many IO pins and tester 110 can test a DUT having up to four times as many IO pins. As discussed above, any scaleable channel of tester 60 can act as two channels communicating with two DUT IO pins as long as no more than two test activities occur at either of the two DUT IO pins during any test cycle. Any scaleable channel of tester 110 can act as three or four conventional tester channels, each communicating with a separate DUT IO pin as long as no more than one test activity is required at any of the three or four DUT IO pins during any test cycle. Tester 110 can also act as two convention channels communicating with two DUT IO pins as long as no more than two test signal state changes or DUT output signal sampling activities are required at either of the two DUT IO pins during any test cycle. A channel of either tester 60 or 110 can act as a single tester channel carrying out up to four test activities per test cycle at a single DUT IO pin. The number of channels each scaleable channel of tester 60 or 110 is software configurable because it is controlled by data a host computer writes into its internal TSET and FSET decoding RAMs.

Figure 2:
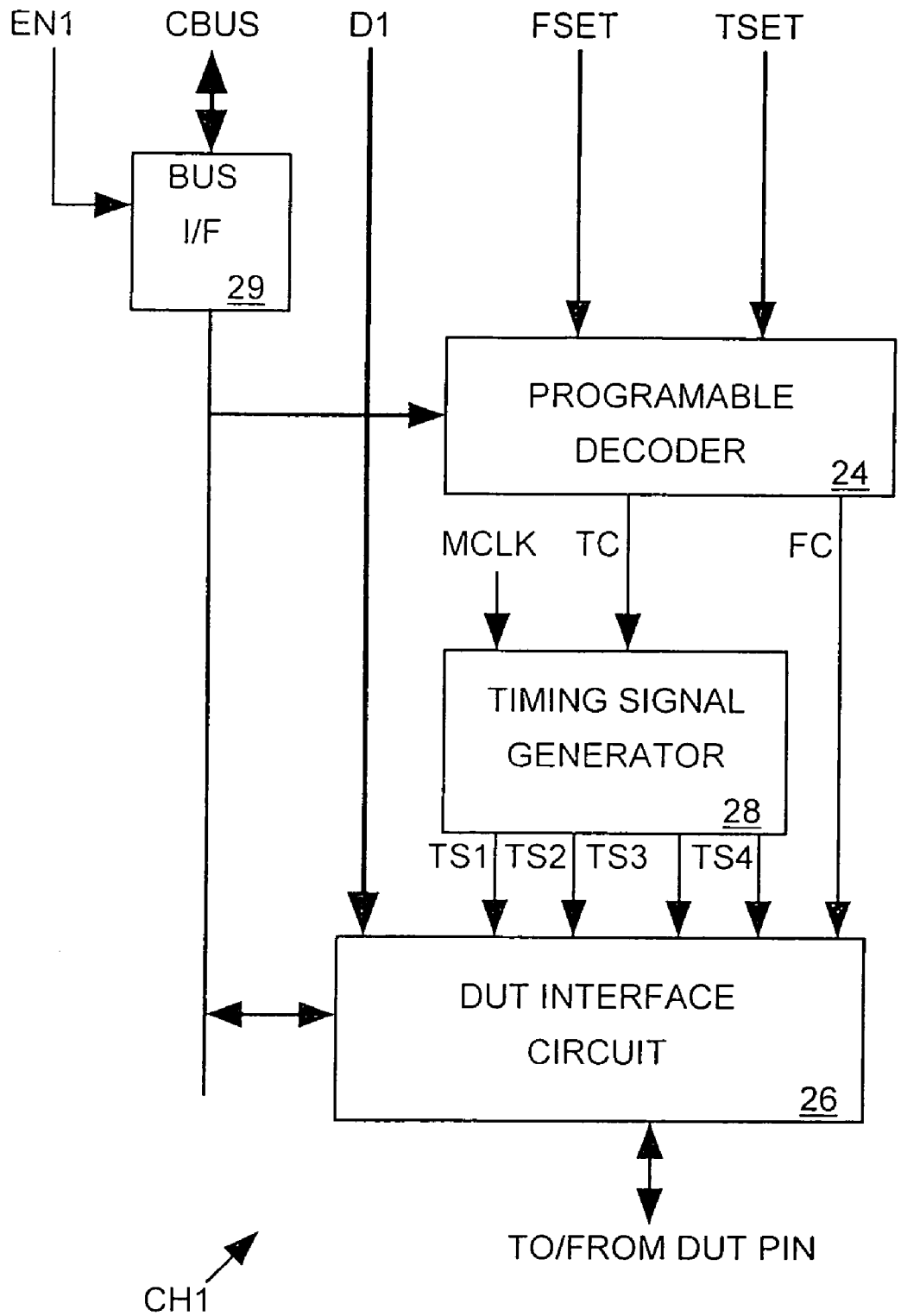
FIG. 2 depicts one of the channels of the IC tester of FIG. 1 in more detailed block diagram form.
Figure 3:
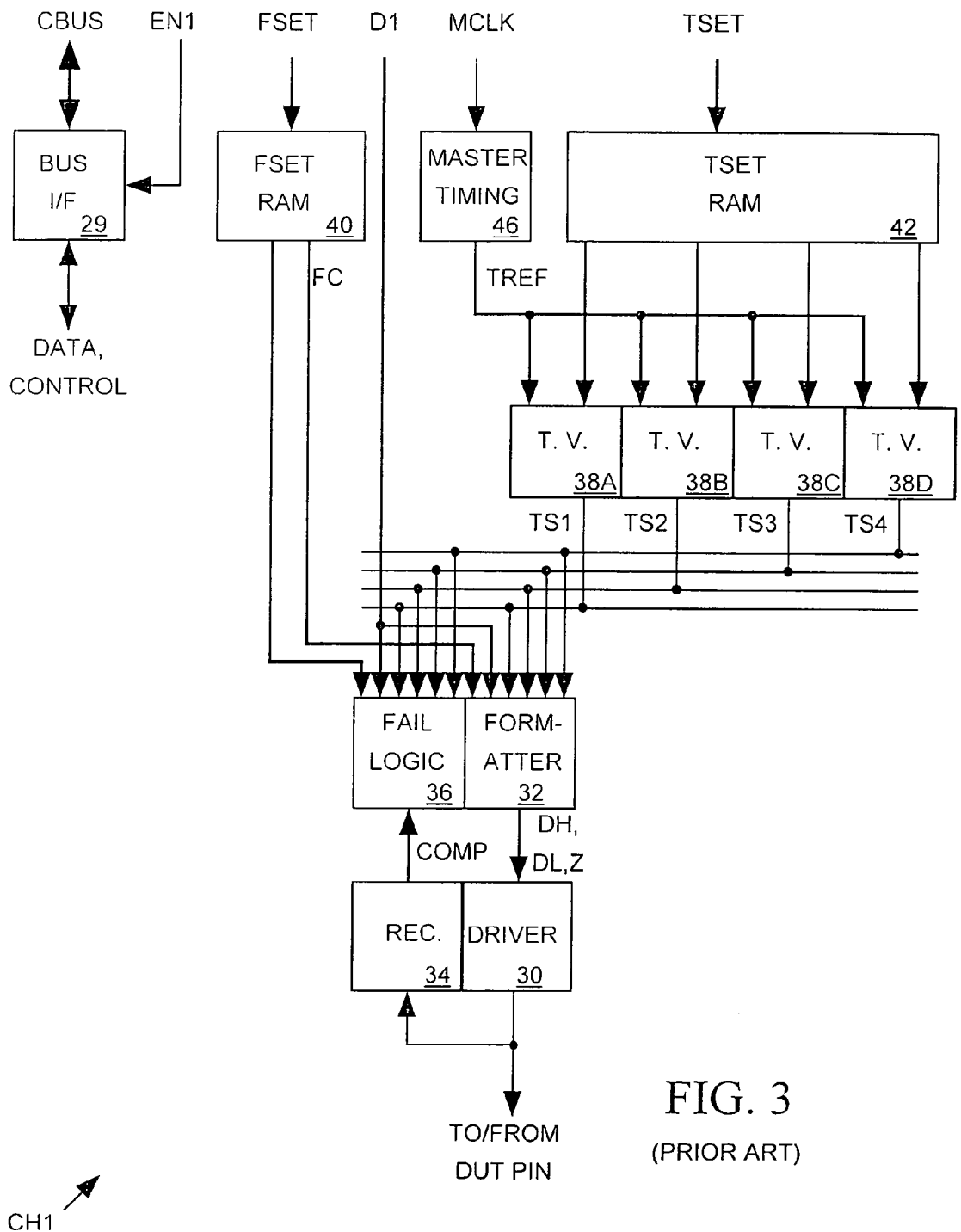
FIG. 3 depicts the channel of FIG. 2 in still more detailed block diagram form.

The cost of the added capability of the improved testers 60 and 110 over that of prior art tester 10, in terms of additional components that must be added to an IC implementing the improved testers is not large. Referring to FIGS. 1, 4 and 7, enable RAM 70 of tester 60 must be twice as wide as enable RAM 20 of tester 10, and the number of bits of enable signals E1-EN that the IC must route between the enable RAM and the scaleable channels doubles from N to 2N. Enable RAM 112 must be four times as wide as RAM 20. Since RAM 20 is relatively small, doubling or quadrupling its size does not add much to the IC floor space of tester 60 or 110. There are differences between the internal structure of prior art channel CH1 of FIG. 2 compared to the improved scaleable channels CH1' of FIG. 6 or CH1' of FIG. 8. In particular scaleable channels CH1' of FIGS. 6 and 8 include more DUT interface circuits than prior art channel CH1, and replace each large FSET or TSET RAM with two or four smaller, separately accessible, RAMs. However the channel modifications do not substantially increase the IC floor space required by the channels. Thus with a relatively small increase in the required IC floor space, the invention provides improved IC testers 60 or 110 that can accommodate up to two or four times as many DUT IO pins as the prior art tester 10 of FIG. 1.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. An apparatus for carrying out test activities at input/output (IO) pins of an IC device under test (DUT) during a succession of test cycles, wherein the test activities include changing a state of a tri-state test signal supplied to any DUT IO pin and sampling a DUT output signal appearing at any DUT IO pin, the apparatus comprising:
    a pattern generator programmed to generate data before each test cycle encoded to specify all test activities to be carried out during the test cycle and to specify for each test activity a time during the test cycle at which the test activity is to be carried out and a DUT IO pin at which the test activity is to be carried out; and
    N programmable channels, where N is an integer greater than 1, each comprising
        a plurality of DUT interface circuits, each of which can be connected to a separate DUT IO pin for carrying out test activities at that DUT IO pin when signaled to do so, and
        hardware resources programmed by decoding instructions to decode the data from the pattern generator for each test cycle and initiate each specified test activity during the test cycle by signaling the DUT interface circuit that is specified for the test activity at the time specified for the test activity.

2. The apparatus in accordance with claim 1 wherein the data generated by the pattern generator for each test cycle comprises global data supplied in common to all programmable channels and separate channel data supplied to each programmable channel.

3. The apparatus in accordance with claim 1
    wherein at least one of the N programmable channels comprises J DUT interface circuits, where J is an integer greater than 1,
    wherein the hardware resources can initiate up to M test activities per test cycle, where M is an integer at least as large as J, and
    wherein the decoding instructions allocate the hardware resources so that the hardware resources signal only those of the J DUT interface circuits of said one programmable channel that are to carry out the up to M test activities per test cycle specified by the data from the pattern generator.

4. The apparatus in accordance with claim 3
    wherein in a first operating mode the decoding instructions allocate the hardware resources for signaling only one of the J DUT interface circuits of said one programmable channel to carry out the up to M test activities per test cycle, and
    in a second operating mode the decoding instructions allocate the hardware resources for signaling at least two of the J DUT interface circuits of said one programmable channel to carry out the up to M test activities per test cycle.

5. The apparatus in accordance with claim 3
    wherein the hardware resources generate M timing signals,
    wherein at least one of the J DUT interface circuits receives all of the M timing signals, and
    wherein at least one of the J DUT interface circuits receives fewer than all of the M timing signals.

6. The apparatus in accordance with claim 5 wherein the hardware resources comprise:
    a decoder programmed by the decoding instructions for receiving and decoding data from the pattern generator for each test cycle to produce timing control signals, and
    a timing signal generator for generating the M timing signals in response to the timing control signals.

7. The apparatus in accordance with claim 6
    wherein the data generated by the pattern generator for each test cycle comprises global data supplied in common to all programmable channels,
    wherein the global data for each test cycle comprises time set data, and
    wherein the decoder decodes the time set data to generate the timing control signals.

8. The apparatus in accordance with claim 3
    wherein the data generated by the pattern generator for each test cycle comprises global data supplied in common to all programmable channels,
    wherein the global data for each test cycle comprises format set data,
    wherein the decoder decodes the format set data to generate format control signals, and
    wherein the decoder comprises J format set random access memories (RAMs), each format set RAM corresponding to a separate one of the J DUT interface circuits, each addressed by the format set data and reading out separate format control data to its corresponding DUT interface circuit.

9. The apparatus in accordance with claim 8 further comprising,
    a programming circuit for supplying decoding instructions in common to all programmable channels and a separate set of enable signals to each programmable channel, each corresponding to a separate one of the programmable channel's format set RAMs,
    wherein some of the decoding instructions include format control data, and
    wherein each programmable channel further comprises a bus interface circuit for writing the format control data included in any decoding instruction it receives from the programming circuit into every one of the format set RAMs for which the programming circuit is asserting a corresponding enable signal.

10. The apparatus in accordance with claim 6 wherein the timing signal generator comprises:
    a master timing circuit for generating a set of timing reference signals, having edges occurring at separates times during each test cycle, and
    M timing circuits, each for generating a separate one of the timing signals in response to the timing reference signals.

11. The apparatus in accordance with claim 10 wherein the data each programmable channel receives from the pattern generator also includes time set data, the apparatus further comprising:
    M time set RAMs, each corresponding to a separate one of the timing circuits, each time set RAM addressed by the time set data and reading out separate timing control data to its corresponding timing circuit, and
    wherein the M timing circuits generate the respective timing signals in response to the timing reference signals and the timing control data.

12. The apparatus in accordance with claim 11
wherein some of the decoding instructions supplied by the programming circuit include timing control data,
wherein each time set RAM corresponds to one of the enable signals, and
wherein the bus interface circuit writes the timing control data included in any decoding instruction it receives into any time set RAM when that time set RAM's corresponding enable signal is asserted.

13. The apparatus in accordance with claim 8 wherein each DUT interface circuit comprises:
   a receiver for receiving a DUT output signal produced at a DUT IO pin and producing a comparison signal indicating a logic state of the DUT output signal, and
   a sampling circuit for sampling the comparison signal to determine the logic state of the DUT output signal in response to an edge of a timing signal selected by the format control data received by the DUT interface circuit.

14. The apparatus in accordance with claim 13 wherein each DUT interface circuit further comprises:
   a tristate driver for supplying a test signal to one of the DUT IO pins in response to driver control signals, and
   a formatter circuit for supplying the driver control signals to the tristate driver, wherein the formatter circuit produces the driver control signals in response to the format control signals and the timing signals the first circuit receives.

15. The apparatus in accordance with claim 3,
wherein J is at least 3,
wherein a first of the J DUT interface circuits receives a first of the M timing signals but not a second of the M timing signals,
wherein a second of the J DUT interface circuits receives the second of the M timing signals but not a first of the M timing signals, and
wherein a third of the J DUT interface circuits receives both the first and second of the M timing signals.

* * * * *